United States Patent [19]

Sato et al.

[11] Patent Number: 5,092,031
[45] Date of Patent: Mar. 3, 1992

[54] METHOD AND APPARATUS FOR BONDING EXTERNAL LEADS

[75] Inventors: Koji Sato, Tokyo; Hisao Ishida, Saitama, both of Japan

[73] Assignee: Kabushiki Kaisha Shinkawa, Tokyo, Japan

[21] Appl. No.: 677,374

[22] Filed: Mar. 27, 1991

Related U.S. Application Data

[63] Continuation of Ser. No. 436,468, Nov. 14, 1989, abandoned.

[30] Foreign Application Priority Data

Nov. 15, 1988 [JP] Japan .................. 63-288298

[51] Int. Cl.$^5$ ............... H01R 43/00; B23P 19/00
[52] U.S. Cl. ....................... 29/827; 29/739; 29/740; 174/52.4; 228/180.2
[58] Field of Search ............ 29/739, 740, 741, 827; 228/180.2; 174/52.4

[56] References Cited

U.S. PATENT DOCUMENTS

| | | | |
|---|---|---|---|
| 4,295,596 | 10/1981 | Doten et al. | 228/180.2 |
| 4,727,645 | 3/1988 | Rodin et al. | 29/740 |
| 4,852,250 | 8/1989 | Andrews | 29/827 |
| 4,868,978 | 9/1989 | Seidel et al. | 29/740 X |

FOREIGN PATENT DOCUMENTS

| | | | |
|---|---|---|---|
| 3531715 | 3/1987 | Fed. Rep. of Germany | 29/840 |
| 1-152698 | 6/1989 | Japan | 29/740 |
| 2186218 | 8/1987 | United Kingdom | 29/739 |

OTHER PUBLICATIONS

IBM Technical Disclosure vol. 12, No. 6 Nov. 1969, pp. 793-794 by W. R. Arnold et al.
IBM Technical Disclosure vol. 26, No. 7B Dec. 1983, pp. 3664-3665 by V. D. Lorenzo et al.

*Primary Examiner*—Carl J. Arbes
*Attorney, Agent, or Firm*—Koda and Androlia

[57] ABSTRACT

A method and apparatus for bonding external leads of a solid state device to a lead frame, where a positional discrepancy between the solid state device and the lead frame is corrected not only in X-Y directions but also in the rotational direction so as to perform a high accuracy bonding. Discrepancies in the rotational direction are calculated after detecting two points of the solid-state device, and a sunction head holding such solid-state device is rotated to correct such discrepancy. One portion of the solid-state device is further detected and the discrepancy in X-Y direction is calculated so as to correct the relative positional discrepancy of the solid-state device and the lead frame.

2 Claims, 3 Drawing Sheets

METHOD AND APPARATUS FOR BONDING EXTERNAL LEADS

This is a continuation of application Ser. No. 436,468, filed Nov. 14, 1989, now abandoned.

BACKGROUND OF THE INVENTION

1. Field of the Invention

The present invention relates to a method and apparatus for bonding external leads of a solid-state device to lead frames and substrates.

2. Prior Art

Conventional methods and apparatus for bonding external leads of a solid-state device to a lead frame and substrate (collectively called "lead frames") is described, for example, in Japanese Patent Application Publication Nos. 63-20846 and 63-20847.

In this prior art, a solid-state device which has been punched out of a film carrier is held by a vacuum suction-arm. One point of the external lead of the solid-state device is first detected by a camera so that positional discrepancies in the X-Y direction of the solid-state device can be detected. The data thus obtained is then processed by a recognition unit, and the relative positional discrepancy between the position of the solid-state device and the position of the lead frame is calculated. This calculated data is fed back to a movement control section of an X-Y table which moves the solid-state device, so that the solid-state device is set at a predetermined position on the lead frame. Bonding is then performed.

In the above prior art, only discrepancies in the X-Y direction of the solid-state device can be corrected, and no consideration is given to any discrepancies in the horizontal rotational direction O. As a result, a high degree of precision is not obtained.

SUMMARY OF THE INVENTION

The object of the present invention is to provide an external lead bonding method and apparatus which performs high-precision bonding.

The object of the external lead bonding method of the present invention is achieved by the steps of:

(1) detecting two points of each solid-state device or the external leads thereof, calculating the discrepancy in rotational direction;

(2) rotating a suction-adhesion head about its suction-adhesion part to correct the discrepancy in rotational direction;

(3) detecting again an area of the solid-state device or the external leads thereof, calculating the discrepancy in the X-Y direction; and (4) correcting the relative positioning of the solid-state device in the X-Y direction with respect to a lead frame to which the solid-state device is bonded.

The object of the apparatus of present invention is achieved by a unique structure including (a) a raising and lowering arm driven in the X-Y direction, (b) a guide for correcting discrepancy in rotational direction which is attached to the raising and lowering arm and has guide surfaces, (c) a suction-adhesion head which is free to move along the guide surfaces of the guide part and holds (by means of suction) the solid-state device which has been punched out of a film carrier, (d) a worm gear which rotates on the raising and lowering arm, (e) a motor which rotates the worm gear, and (f) a worm wheel which engages with the worm gear and causes the suction-adhesion head to move along the guide surfaces of the guide. The guide surfaces of the guide used for correcting the rotational direction is shaped in arc which is centered on the suction-adhesion part of the suction-head.

With the above-described method and apparatus, two points of the solid-state device or the external leads thereof are first detected by a detector, and any discrepancy in the rotational direction of the solid-state device is calculated. The motor is then driven so that the discrepancy of the solid-state device (which is held by the suction-adhesion head) is corrected. When the motor is driven, the worm gear rotates, and the worm wheel, raising and lowering arm and suction-adhesion head are moved along the guide surfaces of the guide. Since the guide surfaces of the guide is an arc shape which is centered on the suction-adhesion part of the suction-adhesion head, the suction-adhesion head rotates about its suction-adhesion part so that the discrepancy is corrected.

One point of either the solid-state device or the external leads thereof is detected by the detector, and the positioning discrepancy in the X-Y direction is calculated. Then, the raising and lowering arm is shifted so that the relative positioning discrepancy in the X-Y direction is corrected when the raising and lowering arm is moved over the lead frame.

DETAILED DESCRIPTION OF THE INVENTION

Figure 1:
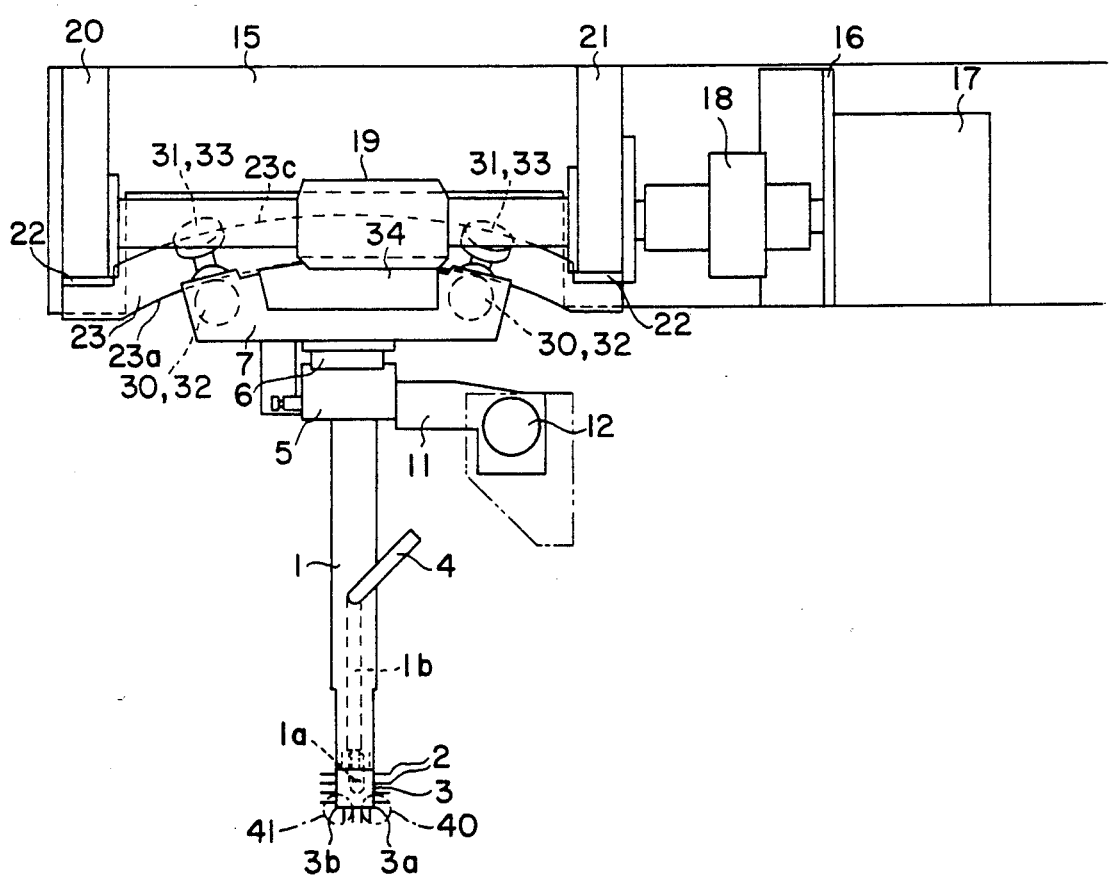
FIG. 1 is a top view of the apparatus of the present invention.
Figure 2:
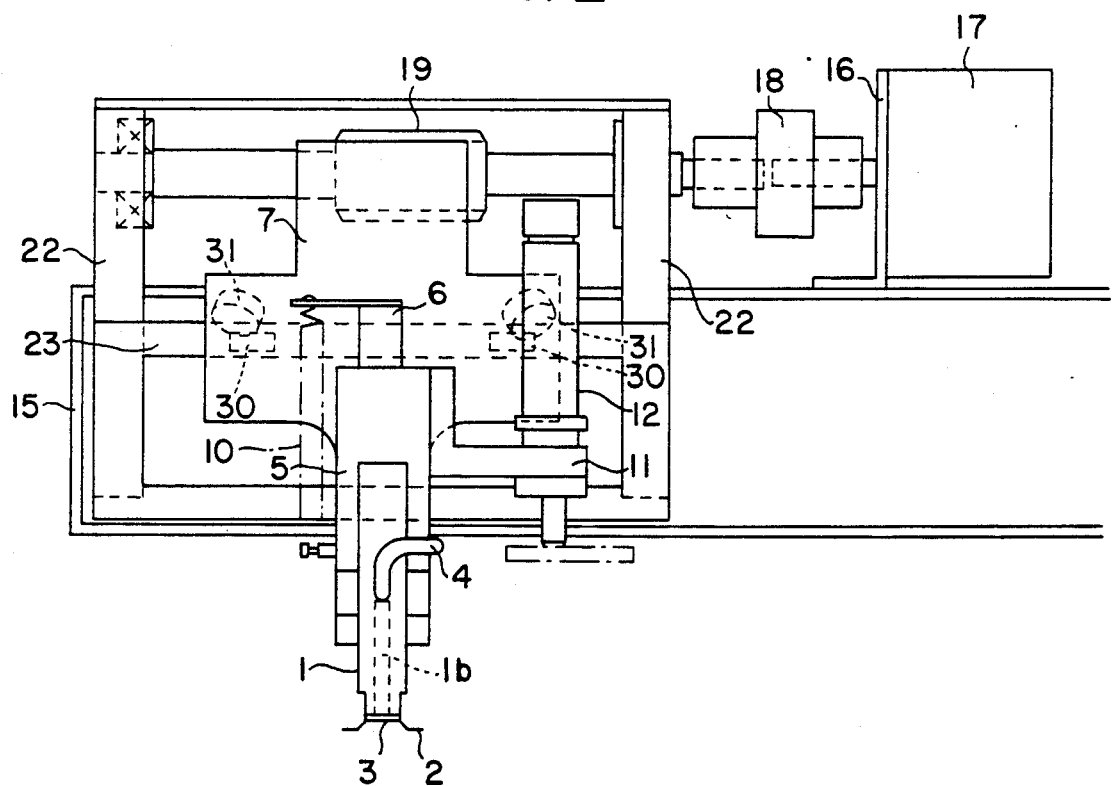
FIG. 2 is a front view thereof.
Figure 3:
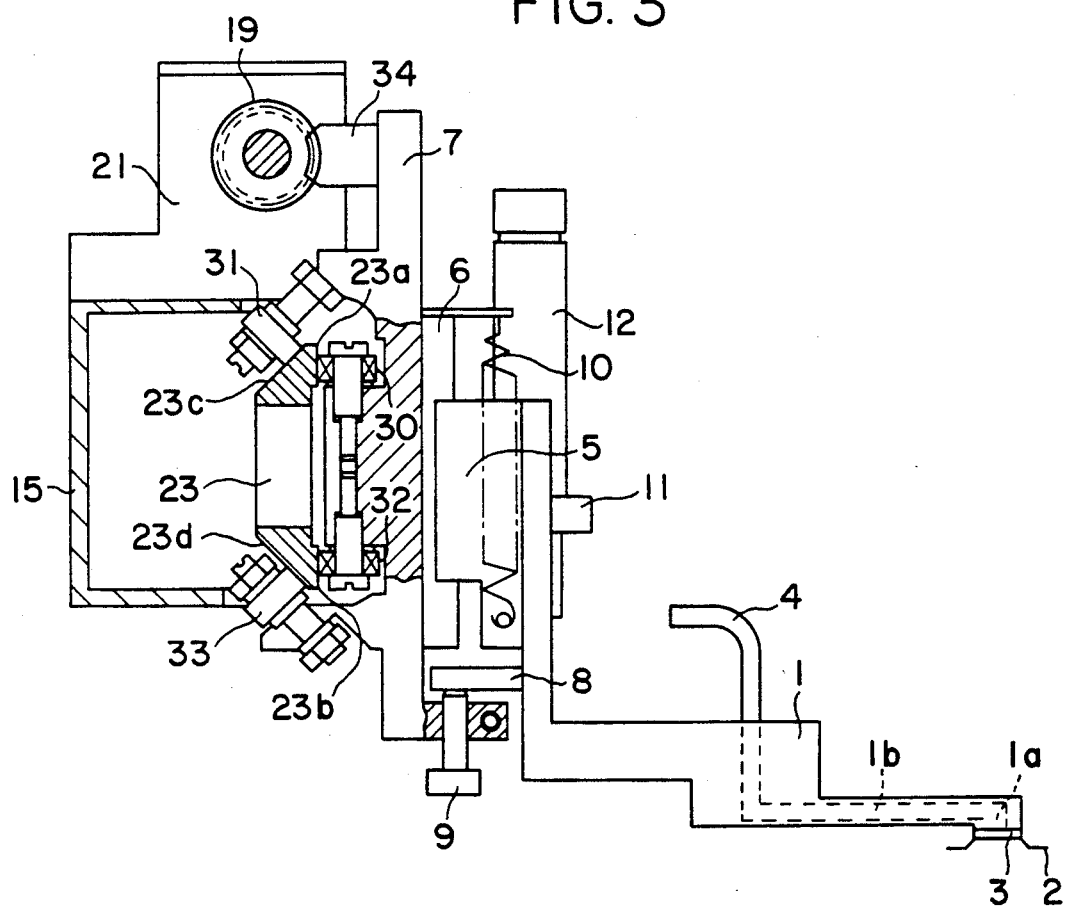
FIG. 3 is a partially sectional side view thereof.

As shown in the accompanying drawings, a suction-adhesion section 1a which holds (by means of vacuum suction) a solid-state device 3, which has external leads 2 and has been punched out of a film carrier, is formed in the undersurface of a tip portion of a suction-adhesion head 1. This suction-adhesion section 1a is connected to a pipe 4 (which is fastened to the suction-adhesion head 1) via a suction-adhesion hole 1b. The pipe 4 is connected to a vacuum source (not shown) through an air pipe (not shown). The suction-adhesion head 1 is fastened to a vertically moving block 5. This vertically moving block 5 is fastened to a supporting plate 6, which has a vertical guide path, so that the block 5 is free to move up and down. The supporting plate 6 is secured to a swing block 7. In order to allow the suction-head 1 to move up and down along with the swing block 7, a stopper pin 8 is fastened to the suction-adhesion head 1 and a stopper screw 9 is screwed into the swing block 7 s that the stopper screw 9 contacts the under surface of the stopper pin 8. Furthermore, in order to reduce the weight of the suction-adhesion head 1 and the vertically moving block 5, the vertically moving block 5 is urged upward by a spring 10. Moreover, a micrometer supporting plate 11 is provided on one of the side surfaces of the vertically moving block 5, and a micrometer 12 is mounted on the micrometer supporting plate 11. The micrometer 12 determines the position to which the suction-adhesion head 1 is lowered when the solid-state device 3 held by the suction-adhesion head 1 is placed on a lead frame.

A motor 17 is mounted on a raising and lowering arm 15 through a motor supporting plate 16. The raising and the lowering arm 15 is roughly C-shaped in cross section and moves in the X and Y directions by a driving means (not shown). The output shaft of this motor 17 is linked to a shaft of the worm gear 19 through a coupling 18. The shaft of the worm gear 19, which protrudes at both ends of the worm gear 19, is supported on bearing supports 20 and 21 so that the shaft is free to rotate. The supports 20 and 21 are fixed to the top surface of the raising and lowering arm 15. Supporting plates 22 which extend vertically downward are fastened to the front surfaces of the bearing supports 20 and 21, and both ends of a guide plate 23 used for correction of rotational direction $\theta$ are fastened to the supporting plates 22. On the guide plate 23 (used for $\theta$ correction), perpendicular guide surfaces 23a and 23b and inclined guide surfaces 23c and 23d are provided. The perpendicular guide surfaces 23a and 23b are formed at the top and bottom of the front surface of the guide plate 23, and the inclined guide surfaces 23c and 23d are formed on the top and bottom of the back surface of the guide plate 23. These perpendicular guide surfaces 23a and 23b and inclined guide surfaces 23c and 23d are formed in arc shape which is centered on the suction-adhesion section 1a of the suction-adhesion head 1.

Rollers 30 and 31 are installed in the left and right positions of the swing block 7 so that these rollers are free to rotate and hold the upper perpendicular guide surface 23a and upper inclined guide surface 23c between them. Similarly, rollers 32 and 33 are installed so that these rollers hold the lower perpendicular guide surface 23b and lower inclined guide surface 23d between them.

A worm wheel 34 which engages with the worm gear 19 is fastened to the swing block 7. The addendum of the worm wheel 34 is formed in a circular arc which is centered on the suction-adhesion part 1a of the suction-adhesion head 1.

Components not specifically illustrated in the Figures are the same as the prior art described earlier. The raising and lowering arm 15 is mounted on a transfer arm which is driven vertically and in the X and Y directions. In addition, a camera which detects the external leads 2 of each solid-state device 3 is installed over the space between the punching unit which punches the solid-state devices 3 out of the film carrier and the bonding station where each of the punched-out solid-state devices 3 is bonded to a lead frame.

Operation of the apparatus will be described below.

First, as in a conventional apparatus, the solid-state device 3 is punched out of a film carrier by the punching unit. The punched-out solid-state device 3 is held by the suction-adhesion part 1a of the suction-adhesion 1. The raising and lowering arm 15 is moved in the X and Y directions so that a first detection area 40 on the solid-state device 3 is positioned beneath the camera. The position of a first point 3a of the solid-state device 3 is then detected. Next, the raising and lowering arm 15 is driven a predetermined distance in the X and Y directions so that a second detection area 41 of the solid-state device 3 is positioned beneath the camera, and the position of a second point 3b on the solid-state device 3 is detected. The discrepancy $\theta$ of the solid-state device 3 is calculated based upon these two detection points 3a and 3b by a calculating device (not shown). The motor 17 is then driven in accordance with the results of the calculation, so that the $\theta$ discrepancy of the solid-state device 3 is corrected.

When the motor 17 is driven, the worm wheel 34 is shifted by the worm gear 19. Thus, the swing block 7 moves along the perpendicular guide surfaces 23a and 23b and inclined guide surfaces 23c and 23d of the guide plate 23 used for $\theta$ correction. Since the perpendicular guide surfaces 23a and 23b and inclined guide surfaces 23c and 23d are arc shaped, and such arc shape is formed with the suction-adhesion part 1a of the suction-adhesion head 1 is centered, the suction-adhesion part 1a of the suction-adhesion head 1 rotates, so that the discrepancy $\theta$ is corrected.

After this, as in a conventional apparatus, the raising and lowering arm 15 is moved predetermined distance in the X and Y directions, so that either the first point 3a or the second point 3b on the solid-state device 3 is positioned beneath the camera. The point 3a or 3b of the solid-state device 3 is then detected, and the positional discrepancy of the solid-state device 3 in the X and Y directions is calculated. The movement of the raising and lowering arm 15 is then corrected pursuant to the results of the calculation so that the solid-state device 3 is positioned directly above the lead frame (not shown). Afterward, the raising and lowering arm 15 is lowered, and bonding is performed.

In the above embodiment, discrepancies are detected by detection of the solid-state device 3; however, it is possible to accomplish the same by detecting the external leads 2 of the solid-state device 3.

As is clear from the above description, the discrepancy $\theta$ of a punched-out solid-state device is corrected prior to bonding the device to lead frames. Accordingly, high-precision bonding is achieved.

We claim:

1. An external lead bonding method for bonding external leads of a solid-state device to a lead frame comprising (a) punching out said solid-state device which is supported by its external leads on a film carrier, (b) holding said punched-out solid-state device by a suction-adhesion head and transferring it to a detection section, (c) calculating a relative positional discrepancy of said solid-state device and said lead frame by a calculating means of said detection section, and (d) feeding back said relative positional discrepancy in accordance with a result of said calculation, to a movement control line of a moving table which moves said suction-adhesion head in X and Y directions so that said solid-state device is positioned at a predetermined position with respect to said lead frame, said X and Y directions being mutually perpendicular to each other and lying in the same plane, and wherein two points of said solid-state device are detected in said detection section to calculate a discrepancy in a horizontal rotation direction;

said suction-adhesion head is rotated about an arc centered about its suction-adhesion section to correct said discrepancy in a horizontal rotational direction;

a point of said solid-state device is re-detected to calculate a discrepancy in said X and Y directions; and a relative positional discrepancy of said solid-state device relative to said lead frame in said X and Y directions is then corrected;

whereby discrepancies in said X, Y and horizontal rotational directions are corrected and high precision bonding is provided.

2. An external lead bonding apparatus for bonding external leads of a solid-state device to a lead frame comprising:
- a raising and lowering arm driven in X and Y directions, said X and Y directions being mutually perpendicular to each other and lying in the same plane;
- a guide for correcting a discrepancy in a horizontal rotational direction, said guide being attached to said raising and lowering arm and having guide surfaces;
- a suction-adhesion head which moves on said guide surfaces of said guide, said suction-adhesion head holding via suction said solid-state device which have been punched out of a film carrier;
- a worm gear which is free to turn on said raising and lowering arm;
- a motor which rotates said worm gear; and
- a worm wheel which engages with said worm gear and causes said suction-adhesion head to move along said guide surfaces of said guide, and
- wherein said guide surfaces of said guide are formed in an arc which is centered on a suction-adhesion part of said suction-adhesion head;
- whereby discrepancies in X, Y and horizontal rotational directions are corrected and high-precision bonding is provided.

* * * * *